United States Patent [19]

Tomisawa et al.

[11] Patent Number: 5,065,204
[45] Date of Patent: Nov. 12, 1991

[54] MAGNETOELECTRIC ELEMENT AND MAGNETOELECTRIC APPARATUS

[75] Inventors: Yutaka Tomisawa, Yokohama; Tetsuo Ishii, Fujisawa; Kazuhiko Inoue, Yokohama, all of Japan

[73] Assignee: Kabushiki Kaisha Toshiba, Kawasaki, Japan

[21] Appl. No.: 602,933

[22] Filed: Oct. 25, 1990

Related U.S. Application Data

[63] Continuation of Ser. No. 238,216, Aug. 30, 1988, abandoned.

[30] Foreign Application Priority Data

Aug. 31, 1987 [JP] Japan .................................. 62-217265
Nov. 20, 1987 [JP] Japan .................................. 62-293174

[51] Int. Cl.$^5$ .................... H01L 27/22; H01L 29/82; H01L 29/96; H01L 43/00
[52] U.S. Cl. .......................... 357/27; 357/14; 357/20; 357/23.6
[58] Field of Search .................. 357/27, 20, 15, 14, 357/23.6; 307/309

[56] References Cited

U.S. PATENT DOCUMENTS

| | | | |
|---|---|---|---|
| 3,668,439 | 6/1972 | Fujikawa et al. | 357/27 X |
| 3,811,075 | 5/1974 | Shiga | 357/27 |
| 4,100,563 | 7/1978 | Clark | 357/27 |
| 4,516,144 | 5/1985 | Jaskolski et al. | 357/27 |
| 4,654,684 | 3/1987 | Vinal | 357/27 |
| 4,689,648 | 8/1987 | Vinal | 357/27 |

OTHER PUBLICATIONS

Takamiya, S. et al., "Differential Amplification Magnetic Sensor", IEEE Trans. on Elec. Dev., Oct. 10, 1972, pp. 1085-1090.

Popovic et al., "An Integrated Silicon Magnetic Field Sensor Using The Magnetodiode Principle," 8093 IEEE Transactions on Electron Devices, Mar. 1984, pp. 286-291.

*Primary Examiner*—Andrew J. James
*Assistant Examiner*—Sara W. Crane
*Attorney, Agent, or Firm*—Finnegan, Henderson, Farabow, Garrett, and Dunner

[57] ABSTRACT

A novel magnetoelectric element and a novel magnetoelectric apparatus convert a magnetic field into an electric capacitance and output it by utilizing the Lorentz force acting on a current in the magnetic field. The magnetoelectric element can convert a magnetic field into an electric capacitance and output it. The magnetoelectric apparatus includes the magnetoelectric element and an electric capacitance detecting unit, and can output a magnetic field as a change in frequency.

24 Claims, 13 Drawing Sheets

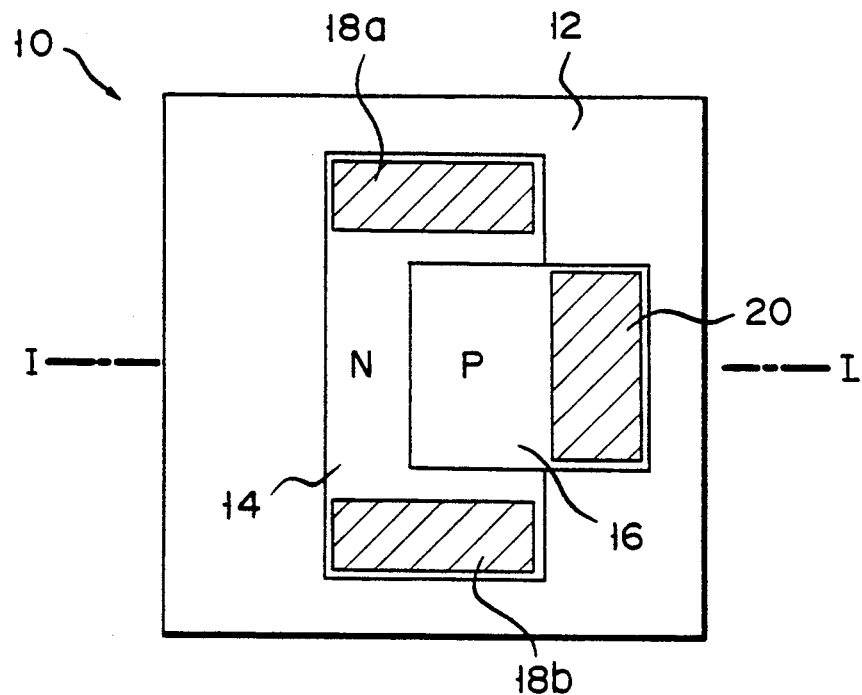
F I G. 6A
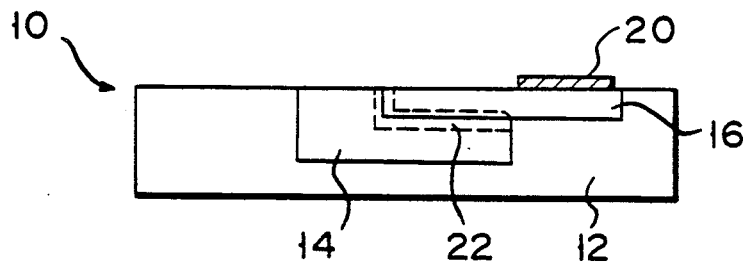
F I G. 6B

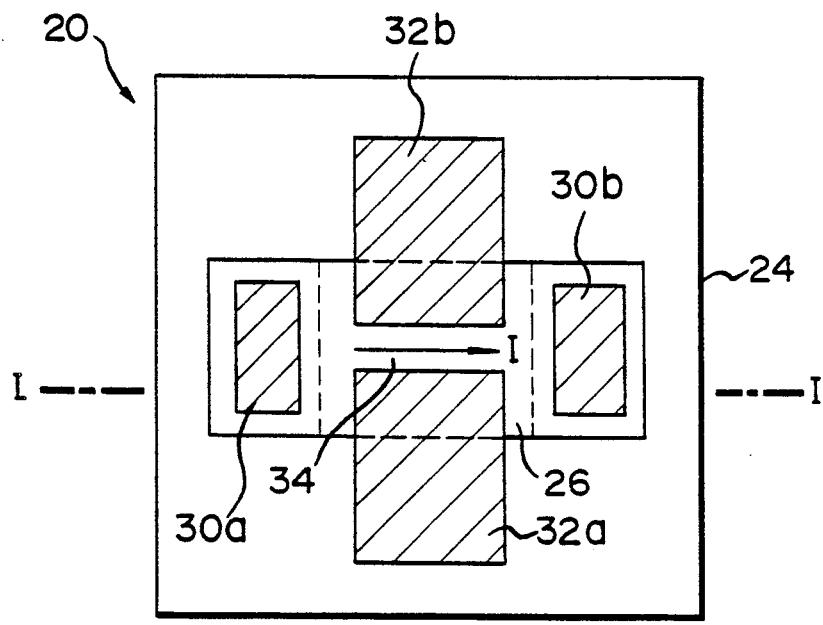
F I G. 7A
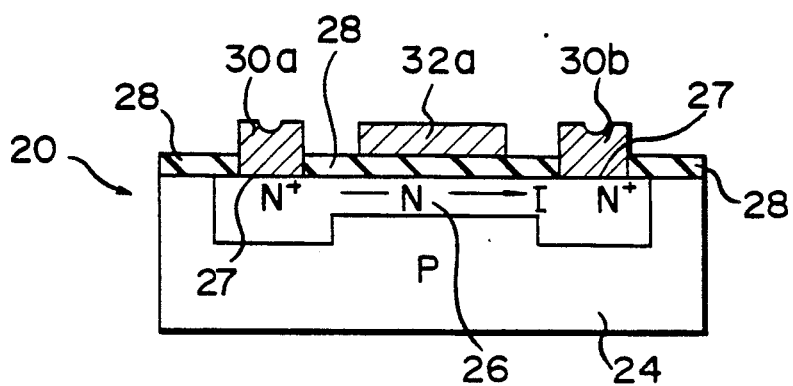
F I G. 7B

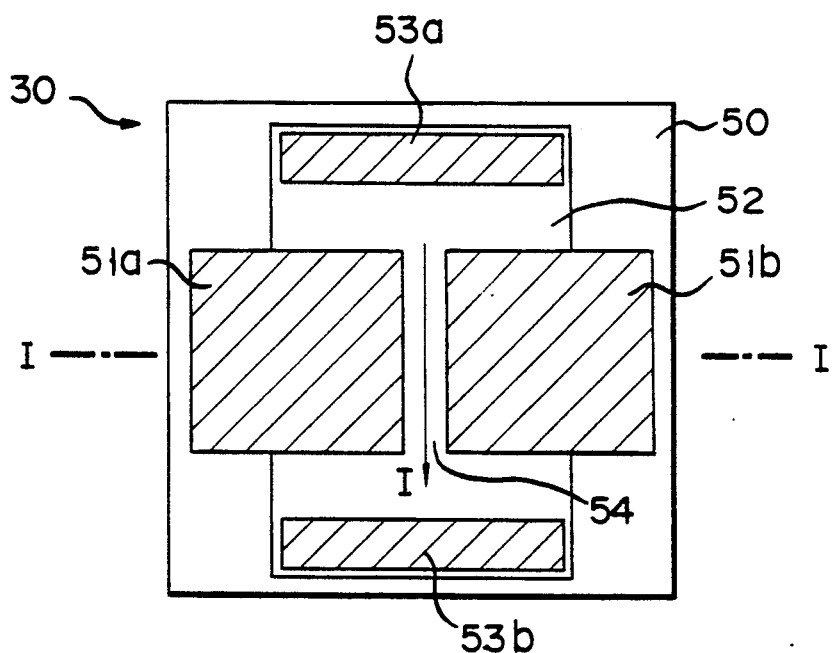
F I G. 11A
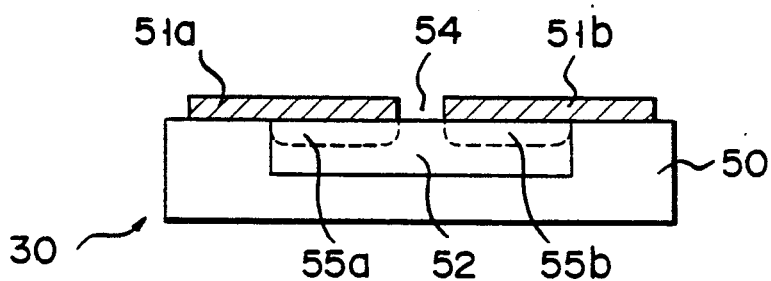
F I G. 11B

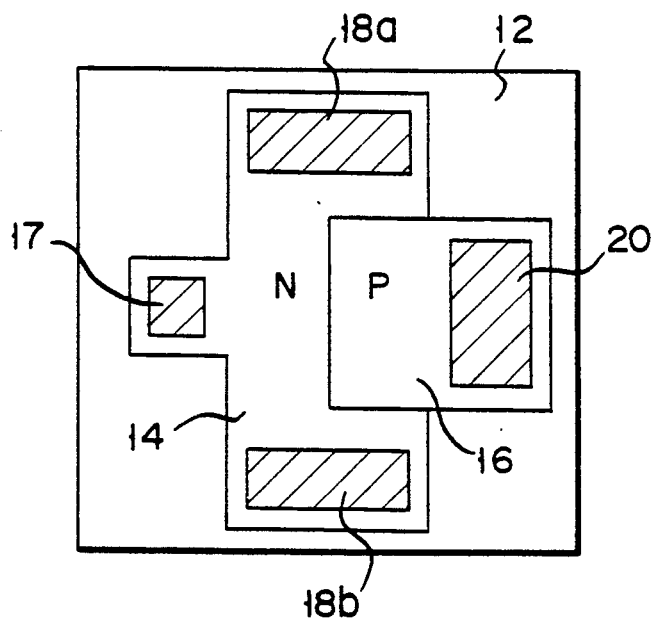
F I G. 13
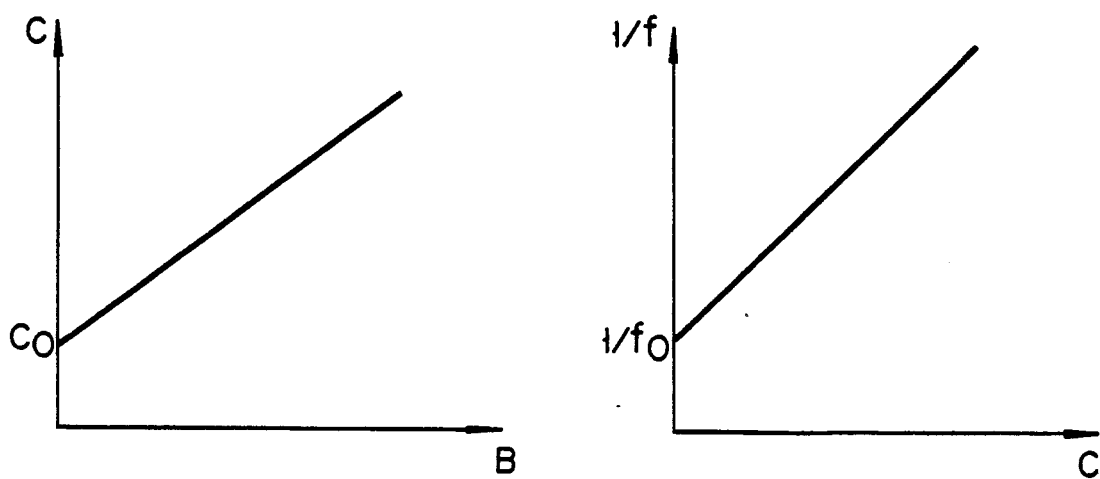
F I G. 14
F I G. 15.

MAGNETOELECTRIC ELEMENT AND MAGNETOELECTRIC APPARATUS

This application is a continuation of application No. 07,238,216, filed Aug. 30, 1988 now abandoned.

BACKGROUND OF THE INVENTION

1. Field of the Invention

The present invention relates to a magnetoelectric element and a magnetoelectric apparatus having the same and, more particularly, to a novel magnetoelectric element for converting a magnetic field into an electric capacitance utilizing a Lorentz force acting on a current in the magnetic field and outputting the converted electric capacitance and a magnetoelectric apparatus having the same.

2. Description of the Related Art

A Hall element which utilizes a Hall effect is well known as a magnetoelectric element. FIG. 1 shows the Hall element. Hall element 1 comprises Cr-doped semi-insulating GaAs substrate 2, cross-shaped magnetoelectric layer 3 obtained by doping an N-type impurity in substrate 2, and four metal electrodes 4a, 4b, 4c, and 4d formed each at four distal ends of a cross portion of layer 3. A current is externally supplied to electrodes 4a and 4b. In this case, current I is supplied in a direction from electrode 4a to 4b. In addition, a magnetic field is vertically applied downward with respect to the drawing surface. Current I is subjected to the Lorentz force caused by the magnetic field and deflected toward electrode 4c. Carriers of the current in N-type magnetoelectric layer 3 are electrons, and the electrons as carriers are deflected toward electrode 4d. Therefore, an electromotive force in which electrode 4c has a positive polarity and electrode 4d has a negative polarity is generated. Since the intensity of the magnetic field is proportional to the Lorentz force acting on the electrons, this electromotive force is proportional to the intensity of the magnetic field. Therefore, the Hall element constitutes a magnetoelectric element capable of converting a magnetic field into an electromotive force.

In FIG. 1, output voltage V generated between electrodes 4c and 4d of the Hall element to which the magnetic field is applied is represented by the following equation:

$$V_H = K^* R_d I B \quad (1)$$

where $K^*$ is a constant called a specific sensitivity, $R_d$ is the electric resistance of a magnetoelectric layer between electrodes 4a and 4b, I is the current between electrodes 4a and 4b, and B is the magnetic flux density. In equation (1), the magnitude of voltage $V_H$ is changed in proportion to the magnetic flux density. Therefore, a signal of voltage $V_H$ is obtained as an analog signal.

In addition, in equation (1), voltage $V_H$ is theoretically not generated when $B=0$, i.e. when no magnetic field is generated. However, a certain noise voltage is actually generated. This is called an off set voltage. Therefore, voltage $V_H$ actually includes off set voltage $V_{H0}$, and equation (1) can be rewritten as follows assuming that an actual output voltage is represented by $V_{HM}$:

$$V_{HM} = V_H + V_{H0} = K^* R_d I B + V_{H0} \quad (2)$$

In equation (2), a condition of $V_H \gg V_{H0}$ must be satisfied in order to detect a minimum magnetic field. $V_{H0}/V_H$ is called an off set ratio, and a product to be actually used must satisfy an off set ratio of 10%. For example, in a Hall element in which $V_H = 100$ mV is obtained when B=1000 gauss, a minimum detection limit of the magnetic field is given as follows:

$$1000 \text{ gauss} \times 10\% = 100 \text{ gauss} \quad (3)$$

Since this value represents a theoretical limit, an actual limit must be twice to three times the theoretical limit in consideration of a practical accuracy. Therefore, an actual minimum limit is 200 to 300 gauss.

As described above, the Hall element has a comparatively large minimum detection limit. In order to further improve the detection sensitivity, $V_{H0}$ must be minimized. However, the presence of $V_{H0}$ is partially caused by a size precision and nonuniformity of component materials in the manufacture of the Hall element. It is difficult to economically reduce inconvenience caused by these factors in the manufacture. For this reason, a demand has arisen for a magnetoelectric element with a high detection sensitivity which can be used in place of the Hall element.

In addition, along with recent progresses in IC techniques, information is generally, digitally processed and controlled. In order to digitally process an output from the Hall element, an output signal from the Hall element must be converted into a digital signal. In order to digitize the output from the Hall element, the output must be analog/digital (A/D)-converted, and a so-called preamplifier for amplifying the output from the Hall element to an output having a predetermined magnitude is necessary. For these reasons, an electric circuit is complicated, and therefore realization of an IC arrangement becomes difficult and an IC becomes expensive.

SUMMARY OF THE INVENTION

It is an object of the present invention to provide a novel magnetoelectric element capable of outputting a signal which can be easily, digitally converted and having a higher detection sensitivity.

According to the present invention, there are provided a magnetoelectric element comprising: a substrate; a semiconductor layer of one conductivity type formed on the substrate; a current supply electrode for supplying a current to the semiconductor layer of one conductivity type; and an electric capacitance detecting electrode for detecting an electric capacitance, and a magnetoelectric apparatus comprising: the magnetoelectric element; and an electric capacitance detecting means formed between the electric capacitance detecting electrode and the current supply electrode of the magnetoelectric element.

A magnetic field can be converted into an electric capacitance and the capacitance can be output by the magnetoelectric element according to the present invention. Therefore, the detection sensitivity of the magnetic field can be further improved. In addition, since the magnetoelectric apparatus of the present invention can output the magnetic field as a change in frequency, a signal which can be easily, digitally converted can be output.

BRIEF DESCRIPTION OF THE DRAWINGS

FIG. 6A is a plan view showing another modification of the first embodiment;

FIG. 6B is a cross-sectional view taken along line I—I of the magnetoelectric element shown in FIG. 6A;

FIG. 7A is a plan view showing a second embodiment;

FIG. 7B is a cross-sectional view taken along line I—I of the magnetoelectric element shown in FIG. 7A;

FIG. 11A is a plan view showing a third embodiment;

FIG. 11B is a cross-sectional view taken along line I—I of the magnetoelectric element shown in FIG. 11A;

FIG. 13 is a plan view showing a modification of the magnetoelectric element used in the magnetoelectric apparatus shown in FIG. 12; and FIGS. 14 and 15 are graphs showing characteristics of the magnetoelectric apparatus.

DETAILED DESCRIPTION OF THE PREFERRED EMBODIMENTS

Figure 2:
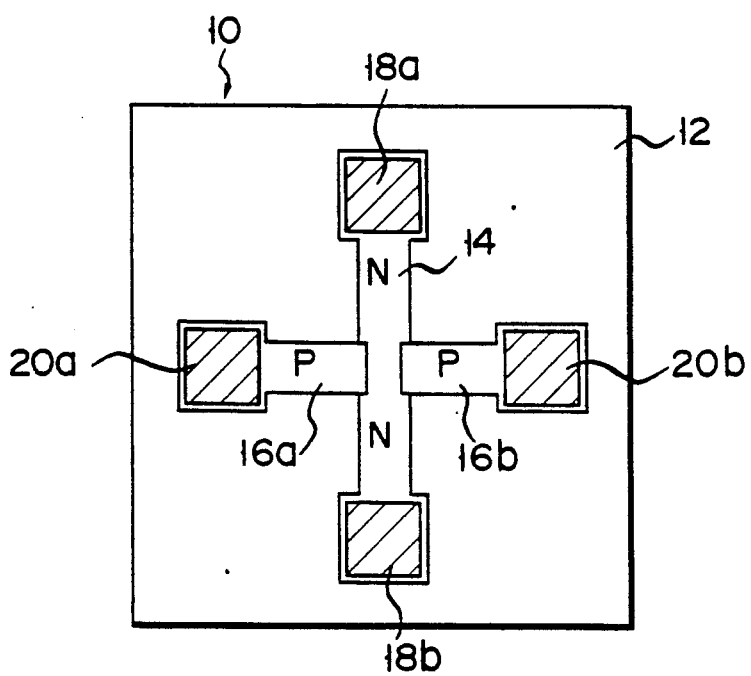
FIG. 2 is a plan view showing a magnetoelectric element according to a first embodiment of the present invention.

FIG. 2 shows a first embodiment of a magnetoelectric element according to the present invention. In magnetoelectric element 10, a substantially rectangular semiconductor layer of one conductivity type, e.g., N-type semiconductor layer 14 is formed on semi-insulating GaAs substrate 12. Semiconductor layers of the other conductivity type, e.g., P-type semiconductor layers 16a and 16b are perpendicularly formed to contact both sides of a central portion of layer 14 and extend in opposite directions. Therefore, PN junctions are formed to sandwich layer 14. In addition, a pair of current supply electrodes 18a and 18b for supplying a current along the PN junction surfaces are formed at both end portions of layer 14, and electric capacitance detecting electrodes 20a and 20b for detecting an electric capacitance of the PN junctions are formed at end portions of layers 16a and 16b, respectively.

Figure 3A:
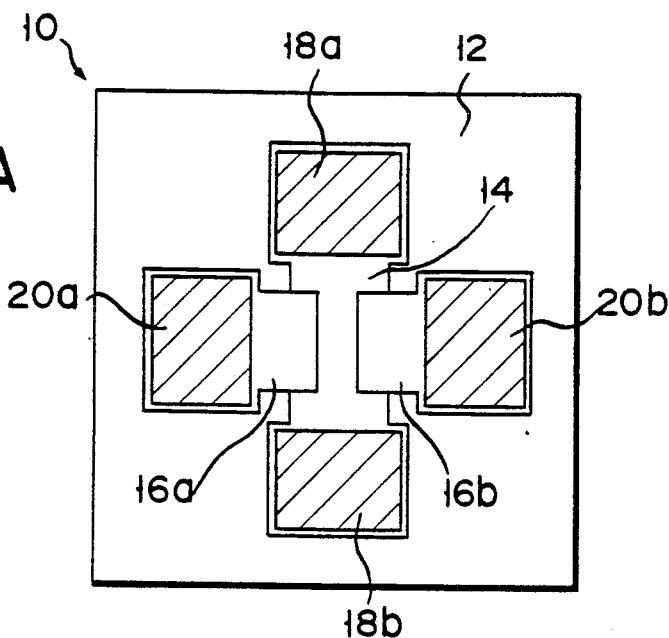
FIG. 3A is a plan view for explaining a series of manufacturing steps of the first embodiment.
Figure 3B:
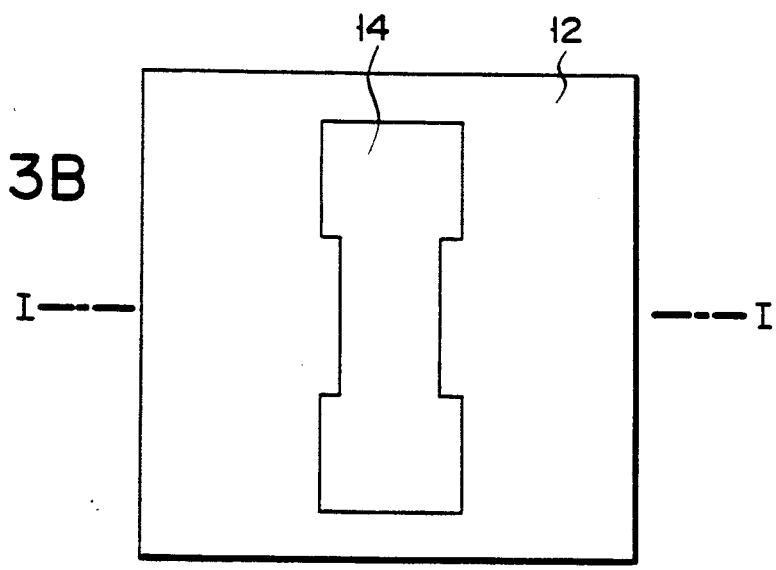
FIG. 3B is a plan view for explaining the series of manufacturing steps of the first embodiment.
Figure 3C:
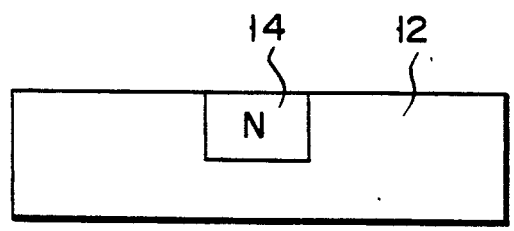
FIG. 3C is a cross-sectional view for explaining the series of manufacturing steps of the first embodiment taken along line I—I of the magnetoelectric element shown in FIG. 3B.
Figure 3F:
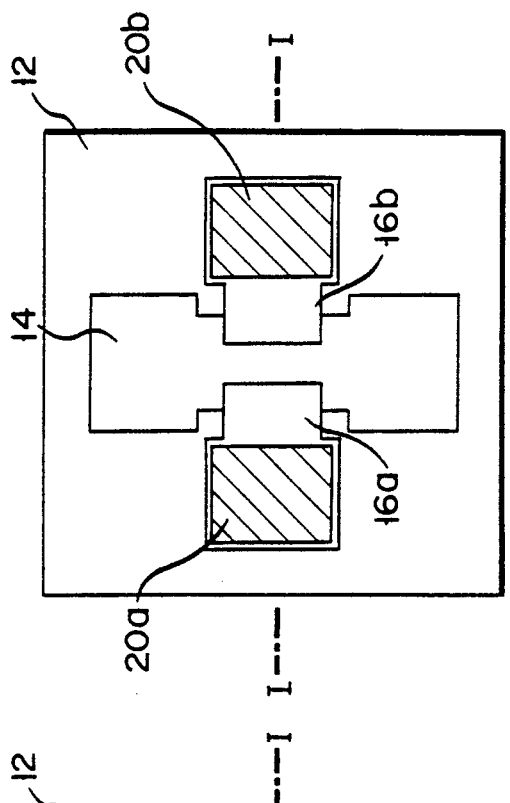
FIG. 3F is a plan view for explaining the series of manufacturing steps of the first embodiment.
Figure 3G:
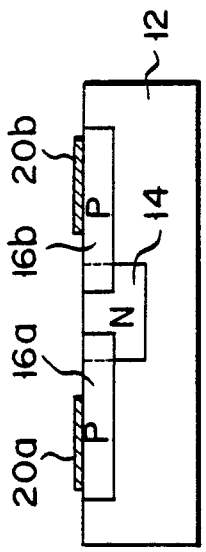
FIG. 3G is a cross-sectional view taken along line I—I of the magnetoelectric element shown in FIG. 3F for explaining the series of manufacturing steps of the first embodiment.
Figure 3D:
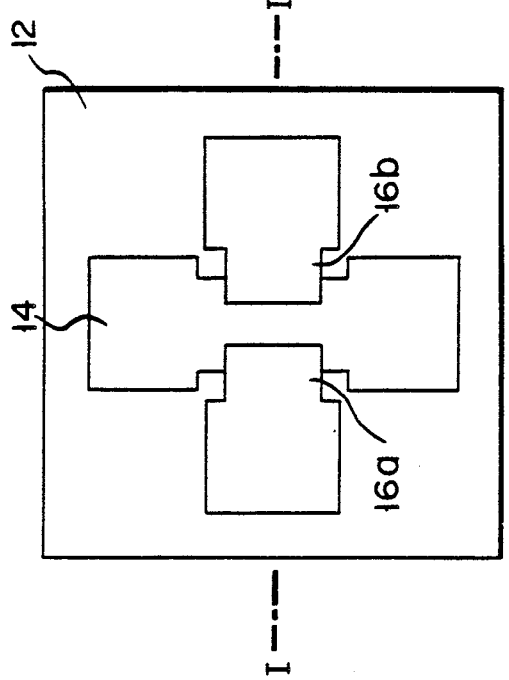
FIG. 3D is a plan view for explaining the series of manufacturing steps of the first embodiment.
Figure 3E:
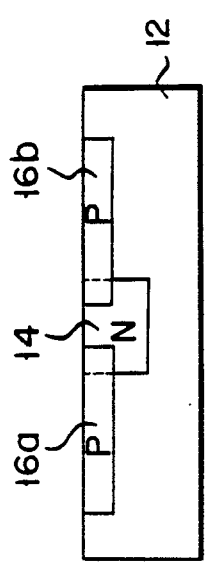
FIG. 3E is a cross-sectional view taken along line I—I of the magnetoelectric element shown in FIG. 3D for explaining the series of manufacturing steps of the first embodiment.

Manufacturing steps of element 10 will be described below. First, as shown in FIGS. 3B and 3C, silicon ions are implanted in a predetermined portion of substrate 12 to form layer 14. Then, as shown in FIGS. 3D and 3E, zinc ions are implanted to form layers 16a and 16b. Thereafter, substrate 12 is annealed at 850° C. for 15 minutes to activate the silicon and zinc ions. Subsequently, as shown in FIGS. 3F and 3G, electrodes 20a and 20b are formed in ohmic contact with the end portions of layers 16a and 16b, respectively. Furthermore, as shown in FIG. 3A, electrodes 18a and 18b are formed in ohmic contact with the both ends of layer 14.

Figure 1:
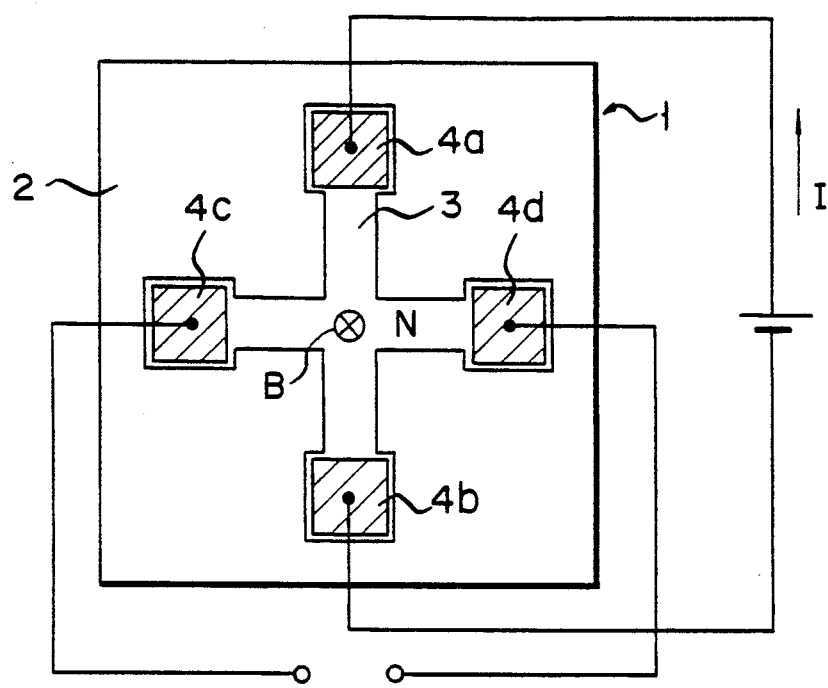
FIG. 1 is a plan view showing a conventional Hall element.
Figure 4:
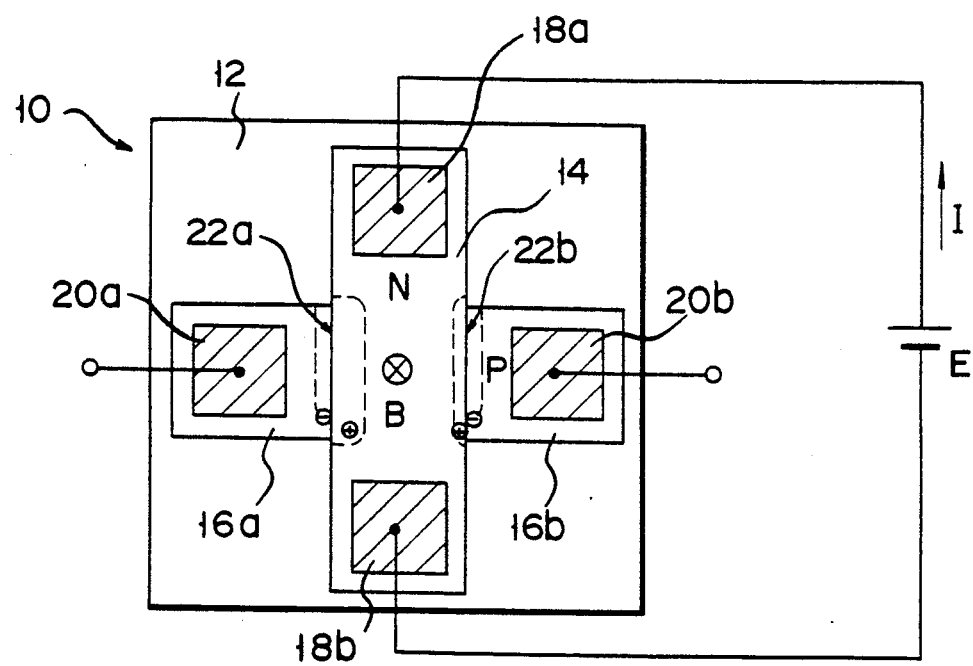
FIG. 4 is a plan view for explaining a function of the first embodiment.
Figure 5:
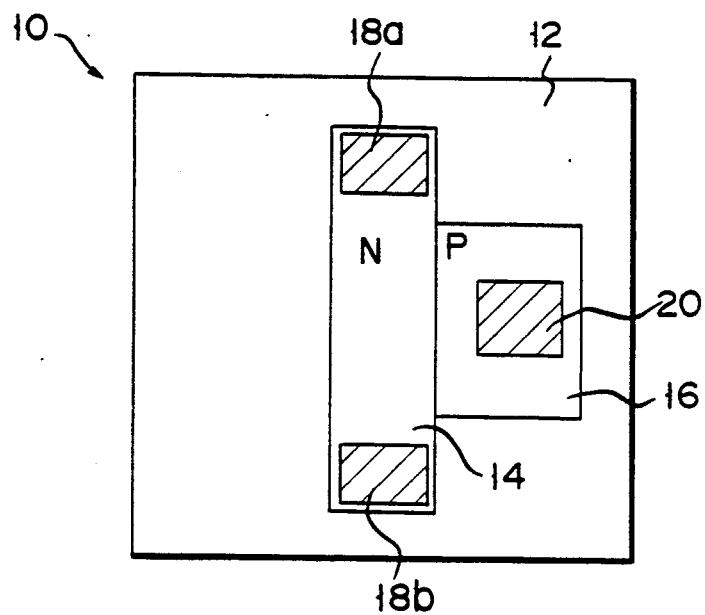
FIG. 5 is a plan view showing a modification of the first embodiment.

Referring to FIG. 4, a function of element 10 will be described. As is well known, a PN junction has an electric capacitance called a junction capacitance. The magnitude of the junction capacitance depends on the shapes of space charge regions (also called depletion layers) 22a and 22b consisting of donor ions $\oplus$ and acceptor ions $\ominus$ and an ion concentration. A current from external power source E is supplied from electrode 18a to electrode 18b along the PN junction surfaces, i.e., the surfaces of layers 22a and 22b. In this state, when a magnetic field is applied to element 10 vertically downward with respect to the drawing surface, an effective electric capacitance between electrodes 20a and 18b is reduced, and that between electrodes 20b and 18b is increased. The reason for this result can be assumed as follows. That is, current I is bent toward layer 22b by the Lorentz force acting on a current in the magnetic field. Therefore, since the density of electrons as carriers of current I is increased at the layer 22b side, the electric capacitance at the electrode 20b side is increased. At the other layer 22a side, the electron density is reduced, and an electric charge of donor ions is increased excessively. Therefore, the electric capacitance at the electrode 20a side is reduced. For this reason, a change in magnetic field intensity can be output as a change in electric capacitance from electrodes 20a and 20b on the basis of an electric capacitance obtained when constant current I is supplied and no magnetic field is applied. A combination of electrodes 20a or 20b and 18a or 18b can be selected in accordance with applications. Although element 10 shown in FIG. 1 has a cross shape substantially the same as the shape of the conventional Hall element, various modifications having other shapes may be made. For example, a modification having a shape including only one PN junction, i.e., only one electric capacitance detecting electrode as shown in FIG. 5 can be made. Magnetoelectric element 10 shown as another modification in FIGS. 6A and 6B has a shape in which P-type semiconductor layer 16 is formed to extend close to a central portion of N-type semiconductor layer 14 and a junction capacitance obtained by a space charge region at a portion of layer 16 in contact with layer 14 is mainly used.

A second embodiment of the present invention will be described below. In FIGS. 7A and 7B, a semiconductor layer of one conductivity type, e.g., N-type semiconductor layer 26 is formed at a predetermined portion of P-type silicon substrate 24. Insulating layer 28 is formed on the surfaces of layers 24 and 26. Current supply electrodes 30a and 30b are formed in ohmic contact with end portions of layer 26 through contact portions (N+) which are in contact with the P-type silicon. Then, electric capacitance detecting electrodes 32a and 32b are formed extending toward layer 24 and having gap 34 be formed in substantially a central portion of layer 26, for forming electric capacitances and detecting the electric capacitances. Current I is supplied by electrodes 30a and 30b from an external power source (not shown) to layer 26 in a direction indicated by an arrow.

Magnetoelectric element 20 of this embodiment is manufactured by a conventional manufacturing method. Phosphorus ions are selectively implanted in substrate 24 to form layer 26, and then the surface is oxidized to form insulating layer 28. Thereafter, layer 28 of contact portion 27 at which electrodes 30a and 30b are to be formed is etched and removed, and electrodes 30a, 30b, 32a, and 32b are formed of, e.g., Al. Then, element 20 is sintered to ohmic-contact electrodes 30a and 30b with layer 26.

Figure 8:
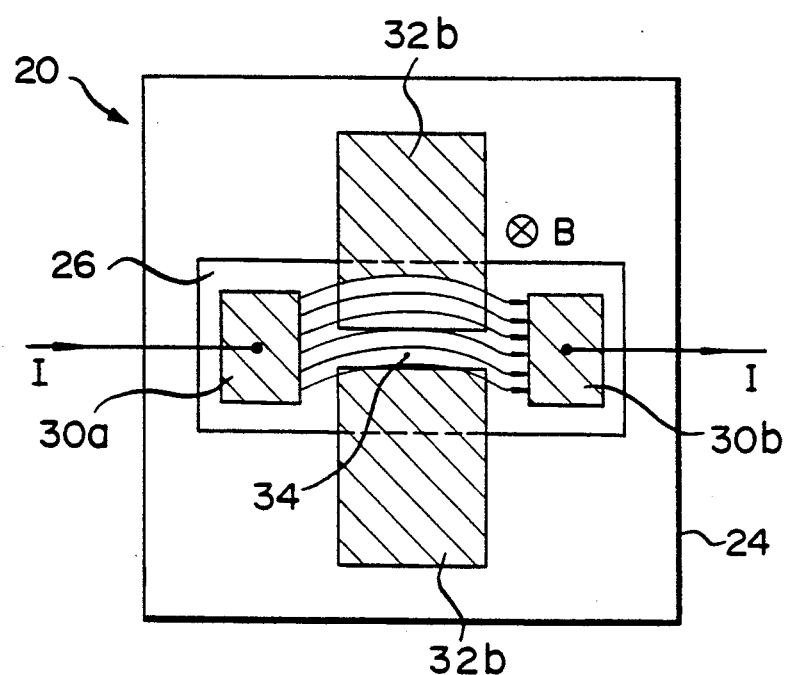
FIG. 8 is a plan view for explaining a function of the second embodiment.

Referring to FIG. 8, a function of element 20 will be described below. Electrodes 32a and 32b are separated from each other by gap 34 and partially oppose layer 26 through layer 28. As a result, an electric capacitance of a so-called MIS structure is formed. An effective electric capacitance per unit area depends on the number of electrons in layer 26. Current I is supplied from electrode 30a to 30b, and magnetic field B is applied vertically downward with respect to the drawing surface. Therefore, the electrons subjected to the Lorentz force by the magnetic field are largely distributed in the electrode 32b side and less distributed in the electrode 32a side. As a result, the effective electric capacitance per unit area between electrodes 32a and 30a or 30b is reduced, and that between electrodes 32b and 30a or 30b is increased. Since changes in electric capacitance depend on the magnitude of the applied magnetic field, the magnitude of the magnetic field can be output as the change in effective electric capacitance.

Figure 9A:
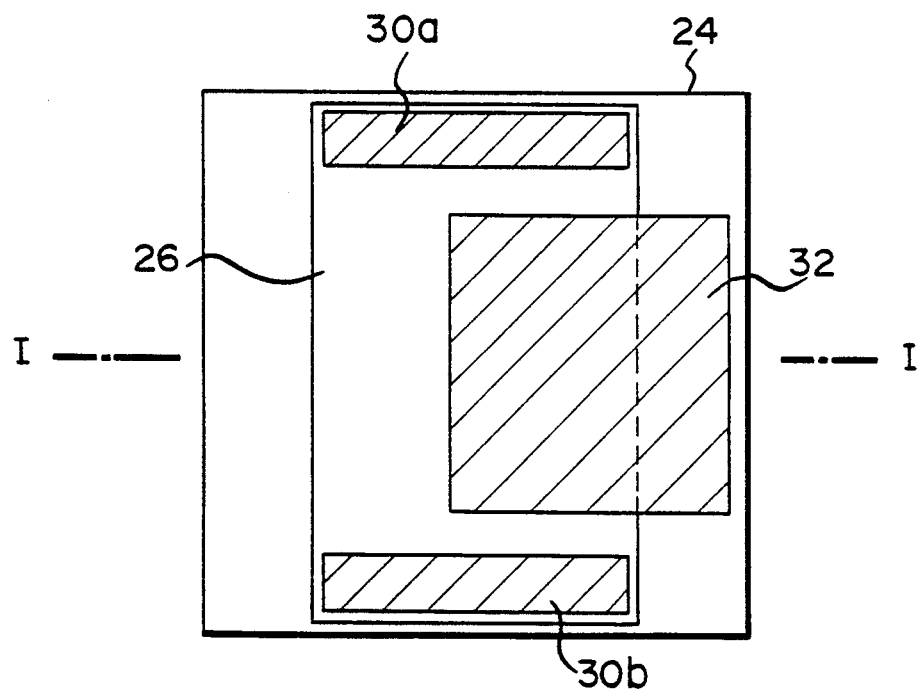
FIG. 9A is a plan view showing a modification of the second embodiment.
Figure 9B:
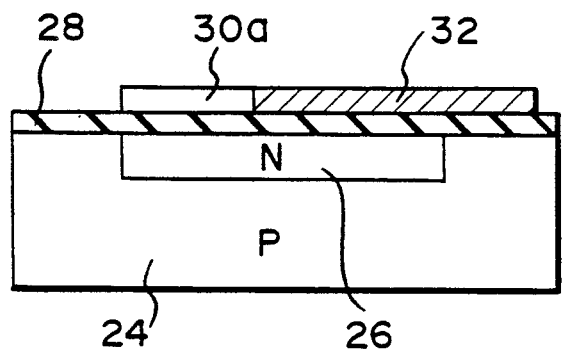
FIG. 9B is a cross-sectional view taken along line I—I of the magnetoelectric element shown in FIG. 9A.

FIG. 9 shows a modification of this embodiment. A magnetoelectric element of this modification has a MIS structure in which one current capacitance detecting electrode is formed. The same effect can be obtained by this modification.

Figure 10A:
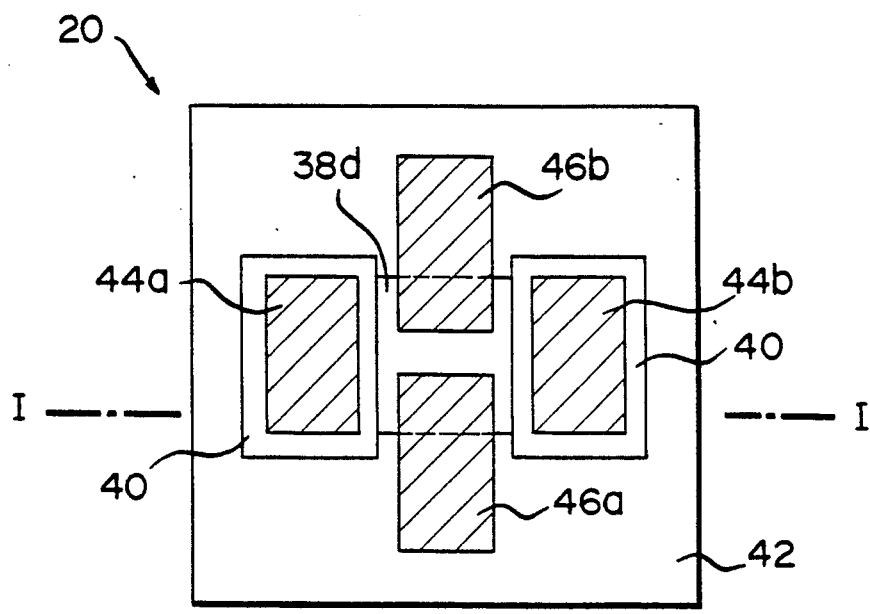
FIG. 10A is a plan view showing another modification of the second embodiment.
Figure 10B:
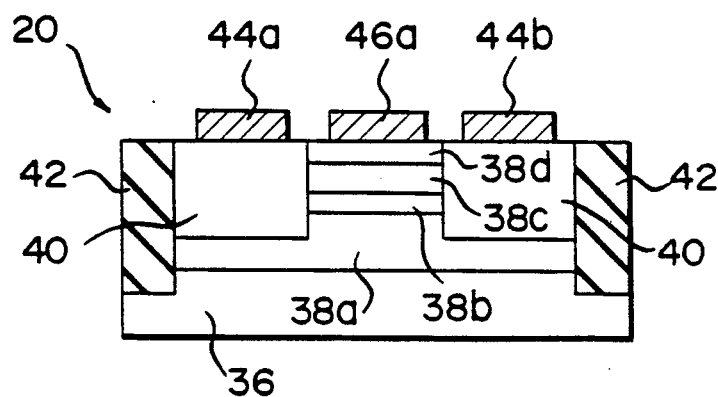
FIG. 10B is a cross-sectional view taken along line I—I of the magnetoelectric element shown in FIG. 10A.
Figure 10C:
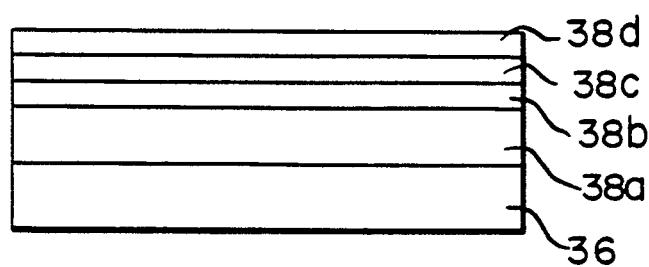
FIG. 10C is a cross-sectional view for explaining a series of manufacturing steps of another modification of the second embodiment.
Figure 10D:
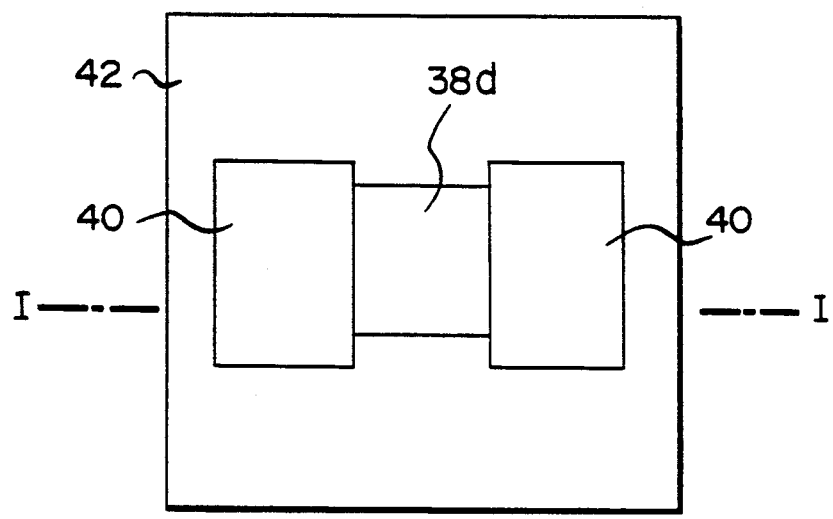
FIG. 10D is a plan view for explaining the series of manufacturing steps of another modification of the second embodiment.
Figure 10E:
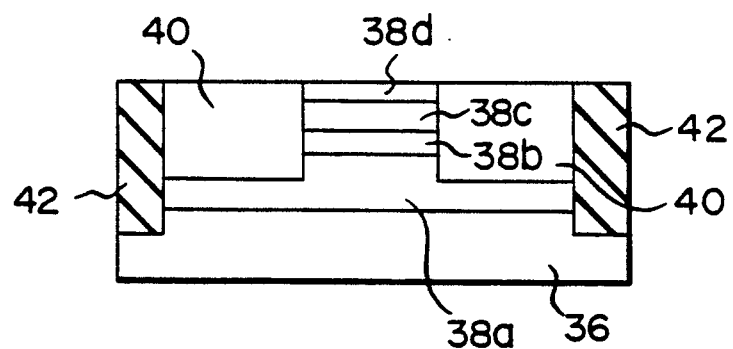
FIG. 10E is a cross-sectional view taken along line I—I of the magnetoelectric element shown in FIG. 10D.

FIGS. 10A and 10B show another modification of the above embodiment. This modification is formed as follows. That is, as shown in FIG. 10C, very thin films of nondoped GaAs 38a, nondoped AlGaAs 38b, Si-doped AlGaAs 38c having a concentration of $1 \times 10^{18}$ cm$^{-3}$, and Si-doped GaAs 38d having a concentration of $1 \times 10^{18}$ cm$^{-3}$ are sequentially stacked on semi-insulating GaAs substrate 36. Then, as shown in FIGS. 10D and 10E, silicon ions are implanted in contact portion 40 at which current supply electrodes are to be formed. Subsequently, in order to isolate the element, boron ions are implanted in isolation region 42 to obtain a high resistance, and annealing is performed at 800° C. for 15 minutes. Thereafter, as shown in FIGS. 10A and 10B, current supply electrodes 44a and 44b and electric capacitance detecting electrodes 46a and 46b are formed at predetermined positions. As a result, a heterojunction is formed by very thin films 38a, 38b, 38c, and 38d. Therefore, a two dimensional electron gas layer is formed near an interface of nondoped GaAs 38a on AlGaAs film 38b. The two dimensional electron gas layer functions similarly to the semiconductor layer of one conductivity type of the MIS structure of the second embodiment. In this case, film 38d improves a contact with respect to contact portion 40. In this modification, other semiconductors such as InP can be used as a substrate. In addition, other two dimensional electron gas structures can be used.

A third embodiment of the present invention will be described below. In FIGS. 11A and 11B, a semiconductor layer of one conductivity type, e.g., N-type semiconductor layer 52 is formed at a predetermined portion of semi-insulating GaAs substrate 50. Electric capacitance detecting electrodes 51a and 51b are formed in contact with the surfaces of substrate 50 and layer 52. The contacts become Schottky contacts. Electrodes 51a and 51b are formed at both sides of gap 54 to oppose each other, and portions of electrodes 51a and 51b which contact layer 52 form Schottky electrodes. A depletion layer capacitance which is an electric capacitance by a Schottky barrier is formed on an interface of the portions of the Schottky electrode. Current supply electrodes 53a and 53b are formed in ohmic contact with both end portions of layer 52. An external power source is connected to electrodes 53a and 53b and supplies a current to layer 52.

Magnetoelectric element 30 of this embodiment is manufactured by a conventional method. That is, silicon ions are implanted in a predetermined portion of substrate 50, and annealing is performed at 850° C. for 15 minutes to activate the ions, thereby forming layer 52. Thereafter, electrodes 53a and 53b of, e.g., AuGe/Ni and electrodes 51a and 51b of, e.g., Ti/Pt/Au are formed by photolithography.

Element 30 of this embodiment utilizes the depletion layer capacitances of layers 55a and 55b at portions at which layer 52 is brought into Schottky contact with electrodes 51a and 51b.

Figure 12:
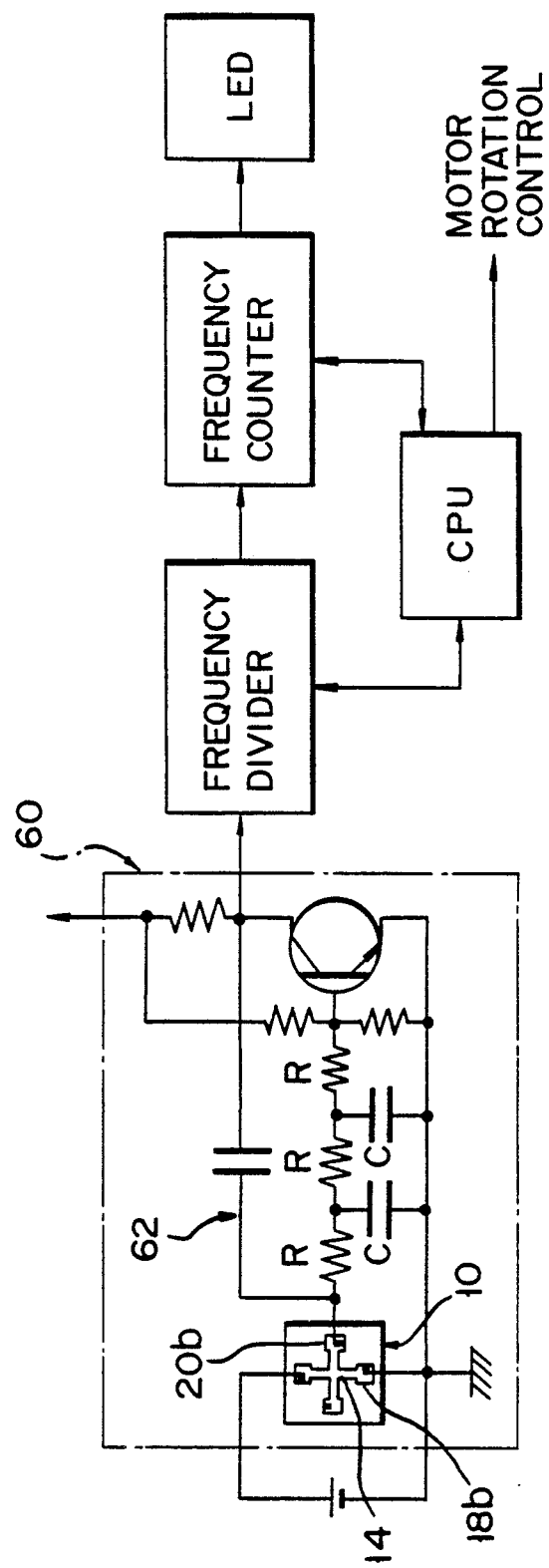
FIG. 12 is a circuit diagram showing the magnetoelectric apparatus according to the embodiment of the present invention.

FIG. 12 shows a preferred embodiment of a magnetoelectric apparatus utilizing a magnetoelectric element of the present invention. In this embodiment, magnetoelectric apparatus 60 includes magnetoelectric element 10 of the first embodiment and CR oscillator 62 as an electric capacitance detecting means. A portion surrounded by an alternate long and dashed line represents apparatus 60. In apparatus 60, element 10 and oscillator 62 are integrated on a single monocrystalline substrate. Oscillator 62 is of a parallel capacitance phase-shift type which is well known to those skilled in the art, in which an electric capacitance between electric capacitance detecting electrode 20b and current supply electrode 18b is used as a capacitance of a phase-shift capacitor. An oscillation frequency of oscillator 62 is changed in accordance with the magnitude of phase-shift capacitor C. An oscillation output from element 10 is supplied to a frequency counter either directly or through a frequency divider; and a magnetic flux density can be displayed by numerals on a display such as LEDs. Alternately, the oscillation output is supplied as a digital control signal to a circuit to be digitally controlled, e.g., a motor rotation controller through a control CPU. Note that a variable permeability capacitor is constituted between electrodes 20b and 18b, and an electric resistance of layer 14 is added as an internal resistance to the variable permeability capacitor. Therefore, a resistance can be set sufficiently low with respect to an R of the CR oscillator. Furthermore, the electric resistance of layer 14 can be positively used. That is, this electric resistance can be used as phase-shift resistance R together with the phase-shift capacitor. In this case, resistance R is arbitrarily set, and branch electrode 17 is formed in the middle of layer 14 as shown in FIG. 13.

An output from element 10 of this embodiment is detected as electric capacitance C. A relationship between capacitance C and magnetic flux density B is shown in FIG. 14. In FIG. 14, C represents an electric capacitance obtained when the magnetic flux density is zero. FIG. 15 shows a relationship between display f of the frequency counter shown in FIG. 12 and capacitance C.

As described above, if the magnetic converting apparatus obtained by connecting the oscillator to the magnetic converting element can output an AC signal, the detection sensitivity of a magnetic field can be largely improved. The reason for this is as follows. That is, in FIG. 14, assume that an output from element 10 is increased from capacitance $C_0$ by $\Delta C$ because a magnetic field is slightly increased. Then, the oscillation frequency shown in FIG. 15 is reduced from $f_0$ by $\Delta f$. In order to detect $\Delta f$, a frequency divider using a reference frequency of a crystal oscillator which is obtained by progresses in IC techniques can be easily used. The crystal oscillator has a precision of $10^{-5}$ or less and therefore can detect with high precision. A temperature stability coefficient of the magnetoelectric element can be reduced to 1% or less by properly selecting GaAs as a material. Therefore, a precision limit depends on a power source variation of the circuit shown in FIG. 12. With recent progresses in IC techniques, a stability of the power source of 1% can be easily obtained. Therefore, as compared with equation (3), the following equation is obtained:

$$1000 \text{ gauss} \times 1\% = 10 \text{ gauss} \qquad (4)$$

That is 10 gauss is a theoretical limit. A practical precision is reduced to 20 to 30 gauss which is twice to three times 10 gauss. As a result, a sensitivity 10 times that of the conventional Hall element can be obtained.

In apparatus 60, the magnetoelectric elements of the second and third embodiments can be used instead of that of the first embodiment to obtain the same functions and effects. Instead of the CR oscillator, other oscillators can be used as the electric capacitance detecting means. That is, any oscillator can be used as the electric capacitance detecting means as long as an electric capacitance between the electric capacitance detecting electrode and the current supply electrode can be used as an electric capacitance of a capacitor which satisfies oscillation frequency conditions. For example, the magnetoelectric element can be used as a C in an LC tuning oscillator or a C for determining a period of a pulse generator.

According to the magnetoelectric element and the magnetoelectric apparatus of the present invention, a field is converted into an electric capacitance and then output. Therefore, the detection sensitivity of the magnetic field can be substantially improved without being affected by an off set voltage of the conventional Hall element. In addition, since an oscillator is used as the electric capacitance detecting means to convert and output the magnetic field as a change in frequency, a signal which can be easily, digitally converted can be output.

What is claimed is:

1. A magnetoelectric device for converting a magnetic field into an electric capacitance comprising:
    a substrate;
    a first conductivity type semiconductor layer disposed on said substrate, said first conductivity type layer having end portions situated at opposite ends of a central portion of a predetermined length;
    at least one second conductivity type semiconductor layer disposed on said substrate, having an edge of predetermined length overlaying a portion of the central portion of the first conductivity type layer, said edge extending in a direction along the length of the central portion of the first conductivity type layer, the edge of the second conductivity type layer and the central portion of said first conductivity type layer defining a PN junction;
    a pair of first electrodes, each disposed in ohmic contact with a respective one of said end portions for supplying a current flowing substantially in parallel to the PN junction along the length of said first conductivity type layer;
    at least one second electrode disposed in ohmic contact with the second conductivity type layer adjacent to said PN junction, said at least one second electrode being a terminal of a capacitance of the PN junction; and
    output means for detecting the capacitance of said PN junction, said capacitance varying with a magnetic field substantially normal to the direction of the current flow along the length of the first conductivity type layer.

2. A magnetoelectric device according to claim 1, wherein two separate second conductivity type semiconductor layers are formed on said substrate and on opposite sides of said central portion of said first conductivity type layer, said two separate second conductivity type semiconductor layers overlaying opposite side portions of said central portion of said first conductivity type layer to form two separate PN junctions.

3. A magnetoelectric device according to claim 1, wherein a second conductivity type semiconductor layer is formed on said substrate adjacent to said central portion of said first conductivity type layer, said second conductivity type semiconductor layer overlaying a side portion of said central portion of said first conductivity type layer to form a PN junction.

4. A magnetoelectric device according to claim 3, wherein said second conductivity type semiconductor layer overlays at least half of a width of said central portion of said first conductivity type semiconductor layer to form a PN junction.

5. A magnetoelectric device for converting a magnetic field into an electric capacitance comprising:
    a second conductivity type substrate;
    a first conductivity type semiconductor layer disposed on said substrate said first conductivity type layer having end portions situated at opposite ends of a central portion of a predetermined length;

an insulating layer overlaying said second conductivity type substrate;

a pair of first electrodes each disposed in ohmic contact with a respective one of said end portions for supplying a current flowing through the length of said first conductivity type layer;

at least one second electrode disposed on said insulating layer said at least one second electrode being a terminal of a capacitance formed between said first conductivity type layer and said at least one second electrode; and output means for detecting the capacitance between said at least one second electrode and said first conductivity type layer, said capacitance varying with a magnetic field substantially normal to the flow of current between said pair of first electrodes along the length of the first conductivity type layer.

6. A magnetoelectric device according to claim 5, further comprising a pair of second electrodes disposed on opposite sides of said central portion of said first conductivity type layer and overlaying a portion of a width of said first conductivity type layer on said insulating layer, said pair of second electrodes opposing each other across a gap, said gap being a separation between said pair of opposing second electrodes formed lengthwise with respect to said first conductivity type layer along a direction of the current supplied from said set of first electrodes to said first conductivity type semiconductor layer.

7. A magnetoelectric device according to claim 5, wherein said at least one second electrode is formed in said insulating layer.

8. A magnetoelectric device according to claim 5, wherein a contact portion is disposed on said substrate to be in contact with said pair of first electrodes.

9. A magnetoelectric device for converting a magnetic field into an electric capacitance comprising:
a semi-insulating substrate;
a semiconductor layer disposed on said substrate said semiconductor layer having end portions situated at opposite ends of a central portion of a predetermined length;
a pair of first electrodes each disposed in ohmic contact with a respective one of the end portions of said semiconductor layer, said pair of first electrodes for supplying a current flowing along the length of said semiconductor layer;
at least one second electrode disposed in ohmic contact with said semiconductor layer, said at least one second electrode serving as a Schottky electrode, and forming a capacitance between said semiconductor layer and said at least one second electrode; and
output means for detecting the capacitance of said PN junction, said capacitance varying with a magnetic field substantially normal to the direction of the current flow along the length of the semiconductor layer.

10. A magnetoelectric device according to claim 9, further comprising a pair of second electrodes formed on said substrate, said pair of second electrodes opposing each other across a gap, said gap being a separation between said pair of second electrodes and being formed along the length of said first conductivity type layer in a direction of the current supplied from said pair of first electrodes to said first conductivity type layer.

11. A magnetoelectric apparatus comprising:
a magnetoelectric device comprising:
a substrate;
a first conductivity type semiconductor layer, said first conductivity type layer having end portions situated at opposite ends of a central portion of a predetermined length;
at least one second conductivity type semiconductor layer overlaying said first conductivity type layer defining a PN junction;
a pair of first electrodes each disposed in ohmic contact with a respective one of said end portions for supplying current flowing substantially in parallel to said PN junction; and
at least one second electrode disposed in ohmic contact with said second conductivity type layer adjacent said PN junction, said at least one second electrode being a terminal of a capacitance of the PN junction;
output means for detecting the capacitance of the PN junction, said capacitance varying with a magnetic field substantially normal to the direction of the current flow along the length of the first conductivity type layer and;
output indication means, responsive to said output means for converting a detected variation in the capacitance of the PN junction into an electric signal.

12. An apparatus according to claim 11, wherein said magnetoelectric device substrate comprises a monocrystalline semiconductor, wherein said output means, and said output indication means are disposed on said substrate.

13. An apparatus according to claim 11, wherein said output indication means comprises a circuit forming a CR oscillator, and wherein the capacitance of said PN junction comprises a first capacitor in said circuit forming said CR oscillator, said capacitance varying with a magnetic field substantially normal to the direction of current flow along the length of said first conductivity type layer providing a phase-shifting input to said circuit.

14. A magnetoelectric apparatus according to claim 11, further comprising;
a third branch electrode disposed opposite said at least one second electrode in ohmic contact with said first conductivity type layer.

15. A magnetoelectric apparatus comprising:
a magnetoelectric element device comprising:
a second conductivity type substrate;
a first conductivity type semiconductor layer disposed on said substrate, said first conductivity type layer having end portions situated at opposite ends of a central portion of a predetermined length;
an insulating layer overlaying said second conductivity type substrate;
a pair of first electrodes each disposed in ohmic contact with a respective one of said end portions for supplying a current flowing along the length of said first conductivity type layer;
at least one second electrode disposed on said insulating layer said at least one second electrode being a terminal of a capacitance formed between said first conductivity type layer and said at least one second electrode;
output means for detecting the capacitance between said at least one second electrode and said first conductivity type layer, said capacitance varying with a magnetic field substantially normal to the flow of current between said pair of first electrodes along the length of the first conductivity type layer and output indication means, responsive to said output means for converting a detected variation in said capacitance into an electric signal.

16. An apparatus according to claim 15, wherein said magnetoelectric device substrate comprises a monocrystalline semiconductor, wherein said output means, and said output indication means are disposed on said substrate.

17. An apparatus according to claim 15, wherein said output indication means comprises a circuit forming a CR oscillator, and wherein said capacitance comprises a first capacitor in said circuit forming said CR oscillator, said capacitance varying with a magnetic field substantially normal to the direction of current flow along the length of said first conductivity type layer providing a phase-shifting input to said circuit.

18. A magnetoelectric apparatus comprising:
a magnetoelectric device comprising:
a semi-insulating substrate;
a semiconductor layer disposed on said substrate, said semiconductor layer having end portions situated at opposite ends of a central portion of a predetermined length;
a pair of first electrodes each formed in ohmic contact with a respective one of the end portions for supplying current flowing the length of said semiconductor layer;
at least one second electrode disposed in ohmic contact with said semiconductor layer, said at least one second electrode serving as a Schottky electrode, forming a capacitance between said semiconductor layer and said at least one second electrode and being a terminal of the capacitance;
output means for detecting the capacitance between said second electrode and said semiconductor layer, said capacitance varying with a magnetic field substantially normal to the flow of current between said pair of first electrodes along the length of the semiconductor layer; and
output indication means, responsive to said output means for converting a detected variation in the capacitance into an electric signal.

19. An apparatus according to claim 18, wherein said magnetoelectric device substrate comprises a monocrystalline semiconductor, wherein said output means, and said output indication means are disposed on said substrate.

20. An apparatus according to claim 18, wherein said output indication means comprises a circuit forming a CR oscillator, and wherein the capacitance of said PN junction comprises a first capacitor in said circuit forming said CR oscillator, said capacitance varying with a magnetic field substantially normal to the direction of current flow along the length of said first conductivity type layer providing a phase-shifting input to said circuit.

21. A magnetoelectric device according to claim 5, wherein a contact portion is disposed on said substrate to be in contact with said first pair of electrodes.

22. A magnetoelectric apparatus comprising:
a magnetoelectric device comprising:
a substrate;
a first conductivity type semiconductor layer, said first conductivity type layer having end portions situated at opposite ends of a central portion of a predetermined length;
a second conductivity type semiconductor layer overlaying said first conductivity type layer defining a PN junction;
a pair of first electrodes each disposed in ohmic contact with a respective one of said end portions for supplying current flowing substantially in parallel to said PN junction;
a second electrode disposed in ohmic contact with said second conductivity type layer adjacent said PN junction, said second electrode being a terminal of a capacitance of the PN junction;
output means for detecting the capacitance of the PN junction varying with a magnetic field substantially normal to the direction of the current flow along the length of the first conductivity type layer and;
output indication means, responsive to said output means for converting a detected variation in the capacitance of the PN junction into an electric signal, wherein said output indication means comprises a circuit forming a CR oscillator, and wherein said capacitance of the PN junction comprises a first capacitor in said circuit forming said CR oscillator, providing a phase-shifting input to said circuit.

23. A magnetoelectric apparatus comprising:
a magnetoelectric device comprising:
a second conductivity type substrate;
a first conductivity type semiconductor layer disposed on said substrate said first conductivity type layer having end portions situated at opposite ends of a central portion of a predetermined length;
an insulating layer overlaying said second conductivity type substrate;
a pair of first electrodes each disposed in ohmic contact with a respective one of said end portions for supplying current flowing along the length of said first conductivity type layer;
a second electrode disposed on said insulating layer, said second electrode being a terminal of a capacitance;
output means for detecting the capacitance between said second electrode and said first conductivity type layer, said capacitance varying with a magnetic field substantially normal to the flow of current between said pair of first electrodes along the length of the first conductivity type layer;
output indication means, response to said output means for converting a detected variation in the capacitance into an electric signal, wherein said output indication means comprises a circuit forming a CR oscillator, and wherein said capacitance between said second electrode and said first conductivity type layer comprises a first capacitor in said circuit forming said CR oscillator, providing a phase-shifting input to said circuit.

24. A magnetoelectric apparatus comprising:
a magnetoelectric device comprising:
a semi-insulating substrate;
a semiconductor layer disposed on said substrate said first conductivity type layer having end portions situated at opposite ends of a central portion of a predetermined length;
a pair of first electrodes each disposed in ohmic contact with a respective one of the end portions for supplying current flowing along the length of the semiconductor layer;

a second electrode disposed in ohmic contact with said semiconductor layer, said second electrode serving as a Schottky electrode, forming a capacitance between said semiconductor layer and said second electrode, and being a terminal of the capacitance;

output means for detecting the capacitance between said second electrode and said first conductivity type layer, said capacitance varying with a magnetic field substantially normal to the flow of current between said pair of first electrodes along the length of the first conductivity type layer;

output indication means, response to said output means for converting a detected variation in the capacitance into an electric signal, wherein said output indication means comprises a circuit forming a CR oscillator, and wherein said capacitance between said second electrode and said first conductivity type layer comprises a first capacitor in said circuit forming said CR oscillator, providing a phase-shifting input to said circuit.

* * * * *

UNITED STATES PATENT AND TRADEMARK OFFICE
CERTIFICATE OF CORRECTION

PATENT NO. : 5,065,204
DATED : November 12, 1991
INVENTOR(S) : Yutaka Towisawa et al.

It is certified that error appears in the above-identified patent and that said Letters Patent is hereby corrected as shown below:

Claim 23, column 12, line 49, change "response" to --responsive--.

Claim 24, column 14, line 3, change "response" to --responsive--.

Signed and Sealed this

Eighth Day of June, 1993

Attest:

MICHAEL K. KIRK

*Attesting Officer*   Acting Commissioner of Patents and Trademarks